United States Patent [19]

Markovich et al.

[11] Patent Number: 5,665,526
[45] Date of Patent: Sep. 9, 1997

[54] THERMALLY STABLE PHOTOIMAGING COMPOSITION

[75] Inventors: Voya Rista Markovich, Endwell; Ashit Arvind Mehta, Vestal; Eugene Roman Skarvinko, Binghamton; David Wei Wang, Vestal, all of N.Y.

[73] Assignee: International Business Machines Corporation, Armonk, N.Y.

[21] Appl. No.: 471,644

[22] Filed: Jun. 6, 1995

Related U.S. Application Data

[62] Division of Ser. No. 594,780, Oct. 9, 1990.

[51] Int. Cl.$^6$ .................... G03C 5/00; C08F 2/46
[52] U.S. Cl. .............. 430/325; 430/280.1; 430/315; 522/31; 522/170
[58] Field of Search .................... 430/325, 280, 430/315, 280.1; 522/31, 170

[56] References Cited

U.S. PATENT DOCUMENTS

| | | |
|---|---|---|
| 3,817,906 | 6/1974 | Tsukioka et al. . |
| 3,824,104 | 7/1974 | Kloczewski . |
| 3,885,977 | 5/1975 | Lachman et al. . |
| 4,003,877 | 1/1977 | Lipson et al. . |
| 4,064,287 | 12/1977 | Lipson et al. . |
| 4,230,814 | 10/1980 | Crivello ................................ 522/25 |
| 4,237,216 | 12/1980 | Skarvinko . |
| 4,246,147 | 1/1981 | Bakos et al. ..................... 260/18 EP |
| 4,252,888 | 2/1981 | Rohloff . |
| 4,260,675 | 4/1981 | Sullivan . |
| 4,358,552 | 11/1982 | Shinohara et al. ................ 523/443 |
| 4,376,815 | 3/1983 | Oddi et al. ......................... 430/313 |
| 4,510,276 | 4/1985 | Leech et al. . |
| 4,544,623 | 10/1985 | Audykowski et al. ............. 430/280 |
| 4,752,553 | 6/1988 | Sullivan . |
| 4,883,730 | 11/1989 | Ahne et al. ........................ 430/325 |
| 4,940,651 | 7/1990 | Brown et al. ..................... 430/325 |
| 4,948,707 | 8/1990 | Johnson et al. . |
| 4,954,415 | 9/1990 | Davis et al. . |
| 5,026,624 | 6/1991 | Day et al. .......................... 430/280 |

FOREIGN PATENT DOCUMENTS 61-93696  5/1986  Japan .

*Primary Examiner*—Mark Chapman
*Attorney, Agent, or Firm*—Calfee, Halter & Griswold LLP

[57] ABSTRACT

A thermally stable photoimaging composition and a method of using the same, especially on circuit boards as a solder mask is provided. The composition includes a polymerizable resin or resin system, a cationic photoinitiator, a solvent, and an optically transparent ceramic filler. Preferably, the composition has a coefficient of thermal expansion of about 28–40 ppm/° C., which closely matches the coefficient of thermal expansion of the solder used on the circuit board components.

16 Claims, No Drawings

THERMALLY STABLE PHOTOIMAGING COMPOSITION

This is a divisional of copending application Ser. No. 07/594,780 filed on Oct. 9, 1990 allowed.

BACKGROUND OF THE INVENTION AND PRIOR ART

This invention relates generally to photoimagable compositions, utilized in the electronics industry, and more particularly to a cationically polymerizable epoxy resin system having photoinitiators which resin system has improved heat withstanding properties, improved expansion coefficient, improved rheological properties and also improved photoimaging properties.

There are many different instances where photoimagable compositions are utilized in various industrial processes. In one particular process a photoimagable composition is utilized as a solder mask and protective coating by applying the composition to the underlying printed circuit board. Thereafter photolithographic techniques are employed to reveal various underlying structures on the board while masking others so that solder may be applied by various solder applying processes to the exposed structures. During the solder applying process the solder will adhere to the exposed underlying components and be prevented from adhering where the remaining material operates as a solder mask.

The solder mask may also function as a protective coating which protects the underlying components from external conditions.

A solder mask can be applied by the appropriate methods; for example curtain coating, spray coating, silk screening and dry film. Solder mask material requires certain rheological properties for effective coating. Further, the solder mask must have the properties of providing efficient transmission of the light or other exposing radiation so as to photolyze the photoinitiator through whatever thickness of material is applied. The solder mask must demonstrate good adhesion to the substrate circuit board and the coating must possess a coefficient of thermal expansion similar to the surrounding material, such as the solder. The solder mask should possess good dielectric properties to provide insulation, it should also provide a good resolution, that is, upon development, the unmasked portions to be soldered should be sharply defined. Also, of course, if the material is to be used as a solder mask, the solder mask must possess appropriate physical and chemical properties to withstand the application of the solder material without significant deterioration or degradation and maintain its coverage over the portions of the board wherein solder is to be masked. If it is to be used for other purposes, other properties may be required.

Different types of soldering processes require different temperatures to reflow. However, in the process for joining chips to board by the "C4" (controlled, collapse, chip, connection process) in a C4 furnace, the temperature is typically 360° C. A typical C4 furnace cycle involves going from 300° C. to 360° C., where it remains for about 1½–2 minutes before returning to 300° C. However, due to the need for rework, the board may be subject to repeat cycles in the furnace.

In the prior art, frequently a patterned chromium layer was utilized as a solder resist mask for chip joining at 360° C. in a C4 furnace. This process involves many steps, therefore, is not cost efficient and also presents a problem with the disposal of processing waste. Another problem is the inability of the chromium layer, which by nature is very thin, to confine the solder conveniently to prevent the flow into unwanted areas.

There is no known solder mask available which is stable at C4 furnace temperatures of 360° C. and which also has acceptable resolution especially for circuits with line height up to 0.002 inches. Thus, a photo patternable solder resist mask demonstrating good adhesion to the substrates, capable of withstanding 360° temperatures, exhibiting good resolution while having a coefficient of expansion compatible with the other layers would be beneficial.

There have been many prior art proposals for different photoimagable compositions including many that use epoxies. Examples of these are found in the following U.S. Pat. Nos.: 4,279,985; 4,548,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197. All of these patents show various resins and photoinitiators for use in photoimagable compositions many of which are useful as solder masks. However none of them teach or suggest the specific composition of the present invention particularly with a controlled coefficient of thermal expansion and clearly match that of solder.

Another use of a photoimagable dielectric is for building fine line redistribution layers on circuit boards. While there are photosensitive dielectrics, they have a high coefficient of thermal expansion and/or they are not capable of withstanding high temperatures (above 360° C.). This factor, combined with high coefficiency of thermal expansion, leads to cracking and degradation of the redistribution layer.

The present invention, due to its low coefficient of thermal expansion, its ability to withstand high temperatures and its photopatternable characteristics, is useful as a fine line redistribution layer.

SUMMARY OF THE INVENTION

The present invention overcomes the drawbacks of the prior art and provides an improved polymerizable composition comprising a cationic polymerizable epoxy resin, preferably EPIREZ SU8, a trademark of Hi-Tek Polymers in Louisville, Ky., a solvent, preferably a mixture of methyl amyl ketone and diisobutyl ketone, an optically transparent ceramic filler, preferably NOVACUP® L337, silicon dioxide manufactured by the Malvern Minerals Company, and a photo-sensitive cationic initiator, preferably GE UVE-1014 or Ciba Geigy RD 87-356. The resulting composition will polymerize upon exposure to ultraviolet radiation. By selectively blocking ultraviolet light from the composition, such as by using a pattern or stencil, the unexposed areas of the composition will not polymerize. The nonpolymerized portions may be developed, that is removed, by dissolving such portions in a suitable solvent. After curing, the remaining polymerized portion becomes fully cross linked to a tough protective coat capable of withstanding exposure to temperatures of 360° C. and having a coefficient of thermal expansion nearly matching that of solder.

DETAILED DISCLOSURE OF INVENTION

The composition and preparation of the material useful as a solder mask is disclosed for joining in C4 furnaces, at high temperatures reaching around 360° C. The invention will provide a photo-patternable process, with specifically defined vias, to confine solder. The invention has a coefficient of thermal expansion of about 28–40 ppm/° C., which is compatible with the other layers of the package, especially that of the solder. The invention also exhibits good adhesion to the substrate; the layer of the solder mask material will act as a protective coat for the entire surface of the electronic surface and act as an encapsulant.

The present invention provides an improved solder resist mask comprising: an cationic polymerizable epoxy resin, preferably EPIREZ SU8, a trademark of Hi-Tek Polymers in Louisville, Ky.; a solvent, preferably a mixture of methyl amyl ketone and diisobutyl ketone, an optically transparent ceramic filler, preferably NOVACUP® L337, a silicon dioxide manufactured by the Malvern Minerals Company; and a photosensitive cationic photo-initiator, preferably GE UVE-1014 or Ciba Geigy RD 87-356. In the preferred embodiment, the following materials are present in the following ratios:

| EPIREZ SU8 epoxy resin | 300 pbw |
|---|---|
| Methyl amyl ketone | 100 pbw |
| Diisobutyl ketone | 20 pbw |
| NOVACUP L337 | 300 pbw |
| GE UVE-1014 or Ciba Geigy RD 87-356 | 30 pbw |

The above formulation is also used as a photo sensitive dielectric to sequentially build a fine line redistribution layer, one layer at a time, resulting in a multilayer structure.

After a multilayer board is constructed, the solder mask is applied using any conventional technique such as screening, dry film application, etc.

The solder mask is then exposed to 50–400 mJ/cm$^2$ of ultraviolet light to accommodate top surface metallurgy. The material is then baked at 60° C. for 15 minutes and developed in a mixture of butyl carbitol and methyl ethyl ketone, for 2 minutes under ultrasonic agitation. Finally, it is cured at 175° C. for 3 hours. The surface is then mechanically toughened to promote adhesion. Full additive plating process follows to fabricate top surface metallurgy.

If required, the above process is repeated to sequentially build more layers.

THE EPOXY RESIN

While many other cationic polymerizable epoxy resins would be suitable, good results have been obtained using EPIREZ SU8 epoxy resin, an epoxidized octafunctional bisphenol A formaldehyde novolak resin available from Hi-Tek Polymers in Louisville, Ky. The EPIREZ resin has an epoxide value of approximately 4.57 equivalents per kilogram, a weight per epoxide of about 215 and melting point of about 82° C. EPIREZ is desirable because of its high functionality. EPIREZ has on an average 8 epoxy groups, each of which is reactive; this results in a good product. Cross-linked EPIREZ SU8 also supplies the needed thermo stability and photoreactive properties.

The resin may be added in an amount from 30% to 70% by weight of the total resin-ceramic filler weight. In the preferred embodiment, the resin is 50% of the total weight of the resin-filler weight.

THE SOLVENT

Many different ketone solvents can be used, including but not limited to: methyl ethyl ketone, acetone, chloroform, trichloroethylene, and methylene chloride. However, methyl amyl ketone (MAK) is preferred. Methyl amyl ketone has an appropriate solubility parameter for the EPIREZ SU8 epoxide resin. Methyl amyl ketone is also desirable since due to its higher boiling point it evaporates more slowly than many of the ketone solvents. Methyl amyl ketone is also classified as non-flammable since its flash point is above 100° F. Furthermore, methyl amyl ketone has less adverse environmental impact than many of the ketone solvents particularly in chlorinated solvents. Diisobutyl ketone, which retards evaporation, also may be added in an amount up to 50% by weight of the methyl amyl ketone.

The solvent may be present from about 10% to 70% by total weight. Below 10%, the solid components of the invention may not be soluble, and the material may be too thick for application. Conversely, if the solvent exceeds 70%, the material may be too thin for proper application.

In the preferred embodiment, the solvent comprised 15.9% by weight of total weight.

THE CERAMIC FILLER

Although any optically transparent ceramic filler could be used, NOVACUP L337 available from Malvern Minerals Co. (Arkansas) is preferred because of its transparency to ultraviolet light and its complying agent treatment for promoting adhesion. The phrase "optically transparent" as used herein means that the material transmits in the range used for exposure, which in the preferred embodiment, is ultraviolet light in a range from at least 310 to 400nm. NOVACUP is silicon dioxide. The silicon dioxide is finely divided, having an average particle size of less than about 6 microns preferably about 3.5 microns. The filler is of particular importance because it contributes to the thermal stability and thermal expansion of the solder mask. By adjusting the amount of the filler, the coefficient of thermal expansion of the composition may be controlled. The ceramic filler may be added from 30% –70% by weight of the combined filler—epoxy resin weight. Where the resin exceeds 70% (and the filler is less than 30%), the coefficient of thermal expansion is too high and no longer compatible with the coefficient of thermal expansion of the solder. Conversely, where the resin is less than the 30% (and the filler exceeds 70%), the composition is not cohesive and falls apart. In the preferred embodiment, the filler is 50% by weight of the combined resin filler weight.

THE INITIATOR

While many other cationic photoinitiator are suitable, good results have been obtained using Ciba Geigy RD 87-356 initiator, which is iron arene compound or GE UVE-1014, which is triarylsulfonium hexafluoroantimonate salt, or more specifically a mixture of a triarylsulfonium hexafluoroantimonate salt and a tetraryl disulfonium hexafluoroantimonate salt.

Although the GE UVE-1014 initiator is much faster than the Ciba Geigy RD 87-356 initiator, the Ciba Geigy initiator is compatible with additive electroless bath.

The initiator may be present from 0.5% to 10%, by weight, of the resin, preferably, 10%. If less than 10% is added, the exposure time must be increased correspondingly. While a sensitizer could be used to adjust development of the pattern, it is not necessary.

PREPARATION

The above materials are mixed by preparing a solution of the resin, preferably EPIREZ SU8 epoxy resin, in the desired solvent, preferably methyl amyl ketone. The solution may then be filtered by a conventional means known to one skilled in the art, particularly if a clean product is desired; however, this is not necessary. The solution is then placed in a high speed disperser and the ultraviolet transparent ceramic filler, preferably NOVACUP L337 is added. The components are mixed below speed of about 1,000 rpm for about 5 minutes, or until the silica is incorporated or blended into the solution. The speed is then increased from about 3,000–5,000 rpm until the silica is dispersed in the resin solution, approximately 10–15 minutes. The initiator, preferably either GE UVI-1014 or Ciba Geigy RD 87-356, is added. The material is then mixed for 5 minutes at speed not greater than 1,000 rpm.

The material may be cast, or it may stored at room temperature, in the absence of ultraviolet light for at least one month.

If an evaporation retardant such as diisobutyl ketone is to be added, it may be added at any stage before casting although it is convenient to add it with the initiator to save an additional mixing step.

The liquid is then coated by conventional methods known to one skilled in the art, such as draw bar, spraying, screening, curtain coating, reverse roll coating or dry film. Good results have been obtained using dry film depending on the equipment available. Dry film may be prepared by applying with a draw bar or by casting the material in a flat sheet on to Mylar, a trademark of Dupont, (commercially available from Dupont or similar material available from Imperial Chemical Industries) or other polyester material. The material is cast to a desired thickness (usually 0.0005–0.002 inches) and dried for about 30 minutes at 60° C. A polyethylene sheet is added to the other side and the material is placed on the circuit board. The polyethylene is then removed, and the material is laminated on to the circuit board, by means known to one skilled in the art. The material is exposed, through the mylar, to a pattern by using an ultraviolet light source, such that the material receives from 50–400 millijoules/cm$^2$. The mylar backing is removed. The material is then baked for about 15 minutes at 60° C. Then the material is developed in a developing solution, such as a mixture of 70 parts by weight butyl carbitol and 30 parts by weight methyl ethyl ketone, for 2 minutes under ultrasonic agitation. The final curing is accomplished at about 175° C. for about 3 hours.

The final protective coat has good resolution and thermal stability at C4 joining temperatures of 360° C. It also has a coefficient of thermal expansion of about 28–40 ppm/° C. (30°–100° C.), which is compatible with solder which typically has a coefficient of thermal expansion of about 27 ppm/° C. In addition, the resulting protective coat demonstrates good adhesion to substrates, particularly to dielectrics such as fluoro polymer substrates such as Rogers 2800 (manufactured by Rogers Corp, Rogers, Conn.) and cyanate resin dielectrics such as those manufactured by Hi-Tek Polymers (formerly Interez of Louisville, Ky.).

While several embodiments of the invention have been shown and described, various adaptations and modifications can be made without departing from the scope of the invention as defined in the appended claims.

What is claimed is:

1. A process for photopatterning a solder mask on an organic dielectric circuit board, such solder mask being thermally stable at 360° C. and having a coefficient of thermal expansion of 28–40 ppm/° C., comprising the steps of:

(a) providing a photosensitive solder mask, consisting essentially of:
   30–70% by a combined resin-filler weight of a cationic polymerizable bisphenol A formaldehyde novolak epoxy resin,
   0.5% to approximately 10% per resin weight of a photosensitive, cationic photoinitiator,
   a solvent and
   30–70% by a combined resin-filler weight of an optically transparent silicon dioxide filler transparent to wavelength of 310 to 400 nanometers, wherein said solder mask is both an encapsulant and a dielectric;

(b) then disposing said solder mask upon the organic dielectric circuit board;

(c) then exposing the solder mask through a pattern to light;

(d) then removing the unexposed areas of the solder mask by placing in a developer;

(e) then applying solder to the patterned circuit board; and (f) then reflowing the solder in a furnace; wherein the solder mask is characterized by adhering to the circuit board during step (f).

2. The process of claim 1, wherein the substrate is a circuit board.

3. The process of claim 1, wherein the light is of a wavelength from 310 nm to 400 nm.

4. The process of claim 1, wherein the developer is a mixture of butyl carbitol and methyl ethyl ketone.

5. The method of claim 1, wherein the epoxy resin is an epoxidized octafunctional bisphenol A formaldehyde novolak resin.

6. The method of claim 1, wherein the epoxy resin has an epoxide value of approximately 4.57 equivalents per kilogram, a weight per epoxide of about 215 and a melting point of about 82°.

7. The method of claim 1, wherein the epoxy resin is present at about 50% by weight of the combined epoxy resin and filler weight and the optically transparent ceramic filler is present at about 50% by weight of the combined epoxy resin and filler weight.

8. The method of claim 1, wherein the photo-initiator is a triarylsulfonium hexafluoroantimonate salt.

9. The method of claim 1, wherein the initiator is a mixture of a triarylsulfonium hexafluoroantimonate salt and a tetraryl disulfonium hexafluoroantimonate salt.

10. The method of claim 1, wherein the initiator is (n$^6$-benzene)(n$^5$-cyclopentadienyl) iron (II) hexafluorophosphate.

11. The method of claim 1, wherein the optically transparent ceramic filler is silicon dioxide.

12. The method of claim 1, wherein the optically transparent ceramic filler has a mean particle size less than about 6.0 microns.

13. The method of claim 1, wherein the composition contains from approximately 10% to approximately 70% per solid weight of solvent.

14. The method of claim 1, wherein the solvent comprises methyl amyl ketone.

15. The method of claim 1, wherein the solvent contains diisobutyl ketone.

16. The method of claim 1, wherein the solvent is approximately 22% total weight methyl amyl ketone and approximately 2% total weight diisobutyl ketone.

* * * * *